(12) United States Patent
Funatsu

(10) Patent No.: US 8,792,244 B2
(45) Date of Patent: Jul. 29, 2014

(54) POWER CONVERTER PERMITTED TO BE REDUCED IN SIZE AND MANUFACTURED AT DECREASED COST

(75) Inventor: Wataru Funatsu, Kariya (JP)

(73) Assignee: Denso Corporation, Kariya (JP)

( * ) Notice: Subject to any disclaimer, the term of this patent is extended or adjusted under 35 U.S.C. 154(b) by 175 days.

(21) Appl. No.: 13/603,527

(22) Filed: Sep. 5, 2012

(65) Prior Publication Data

US 2013/0058068 A1    Mar. 7, 2013

(30) Foreign Application Priority Data

Sep. 6, 2011    (JP) ................................ 2011-193677

(51) Int. Cl.
*H05K 7/00*    (2006.01)

(52) U.S. Cl.
USPC ........... 361/735; 361/699; 361/701; 361/704; 361/676; 361/677; 363/141

(58) Field of Classification Search
CPC ............ H05K 7/20927; H05K 7/2089; H05K 7/20936
USPC .......... 361/735, 699–702, 704, 676–678, 141
See application file for complete search history.

(56) References Cited

U.S. PATENT DOCUMENTS

| | | | | |
|---|---|---|---|---|
| 6,493,227 | B2 * | 12/2002 | Nielsen et al. ................ | 361/703 |
| 7,233,494 | B2 * | 6/2007 | Campbell et al. ............. | 361/699 |
| 7,616,442 | B1 * | 11/2009 | Kaveh ........................... | 361/697 |
| 7,876,563 | B2 * | 1/2011 | Shiba ............................ | 361/699 |
| 2008/0316710 | A1 | 12/2008 | Seto et al. | |

FOREIGN PATENT DOCUMENTS

| | | |
|---|---|---|
| JP | 2006-141096 | 6/2006 |
| JP | 2007-312545 | 11/2007 |
| JP | 2009-005462 | 1/2009 |
| JP | 2010-124523 | 6/2010 |
| JP | 2011-167056 | 8/2011 |
| JP | 2011-172354 | 9/2011 |

* cited by examiner

*Primary Examiner* — Robert J Hoffberg
*Assistant Examiner* — Hung Dang
(74) *Attorney, Agent, or Firm* — Nixon & Vanderhye PC

(57) ABSTRACT

A power converter equipped with a semiconductor stack made up of semiconductor modules, bus bars coupled to power terminals of the semiconductor modules, a capacitor, and an input terminal table. The capacitor is disposed in alignment with a first direction in which the semiconductor modules are stacked. The capacitor has a first end and a second end opposed to the first end in a second direction in which the power terminals extend from the semiconductor modules. The first end faces in the second direction. The input terminal table is located near the second end of the capacitor. This structure permits the power converter to be reduced in size and produced at a decreased cost.

4 Claims, 12 Drawing Sheets

US 8,792,244 B2

POWER CONVERTER PERMITTED TO BE REDUCED IN SIZE AND MANUFACTURED AT DECREASED COST

CROSS REFERENCE TO RELATED DOCUMENT

The present application claims the benefit of priority of Japanese Patent Application No. 2011-193677 filed on Sep. 6, 2011, the disclosure of which is incorporated herein by reference.

BACKGROUND

1. Technical Field

This application relates generally to a power converter equipped with a semiconductor module in which semiconductor devices are fabricated and a capacitor working to smooth the voltage applied to the semiconductor module.

2. Background Art

FIGS. 11 to 13 illustrates a conventional power converter 9, as taught in Japanese Patent First Publication No. 2009-5462, which works to perform power conversion between DC power and AC power. The power converter 9 consists of a plurality of semiconductor modules 92 in which semiconductor devices are installed. Each of the semiconductor modules 92 includes power terminals 920. The semiconductor modules 92 and cooling pipes 98 for cooling the semiconductor modules 92 are laid to overlap each other to form a semiconductor stack 910. The semiconductor stack 910 is disposed in a casing 96 together with other parts.

The power terminals 920 are coupled to bus bars 93 which are made up of a positive bus bar 93a, a negative bus bar 93b, and an ac bus bar 93c. Specifically, the positive bus bar 93a is connected to a positive electrode of a dc power supply (not shown). The negative bus bar 93b is connected to a negative electrode of the dc power supply. The ac bus bar 93c is joined to an ac load. The ac bus bar 93c has terminals 939, as illustrated in FIG. 13, mounted on output terminal tables 913.

The power converter 9 is, as illustrated in FIGS. 11 and 12, also equipped with a capacitor 94. The capacitor 94 works to has two bus bar connector terminals 940 and two input terminals 941. The bus bar connector terminals 940 are coupled to the positive bus bar 93a and the negative bus bar 93b, respectively. The input terminals 941 are coupled to the dc power supply. The capacitor 94 works to smooth a dc voltage applied to the positive bus bar 93a and the negative bus bar 93b. The capacitor 94 is located adjacent the semiconductor stack 910 in a direction (i.e., a Z-direction in FIGS. 11 and 12) in which the power terminals 920 extend.

The capacitor 94 has input terminals 941 to which connecting members 99 are joined for connection to the dc power supply. The connecting members 99 have ends 990 mounted on input terminal tables 912. Connector terminals (not shown) of the dc power supply are laid on and joined to the ends 990 using bolts (not shown). The bolts are inserted into the casing 96 through an opening 960. The input terminal tables 912 is disposed close to the opening 960 for facilitating the ease with which the bolts are fastened into the input terminal tables 912.

The power converter 9, however, faces the following drawback. The input terminal tables 912 are disposed away from the capacitor 94 in the Z-direction, thus resulting in need for increasing the length of the connecting members 99 in the Z-direction, which leads to increase in amount of metal material used in making the connecting members 99 and in production cost of the power converter 9.

The increase in length of the connecting members 99 also results in an increase in space in the casing 96 occupied thereby, thus increasing the overall size of the power converter 9.

SUMMARY

It is therefore an object of this disclosure to provide an improved structure of a power converter which is easy to produce at a decreased cost and permitted to be reduced in size thereof.

According to one aspect of an embodiment, there is provided a power converter which may be employed in automotive vehicles such as electric cars or hybrid cars. The power converter comprises: (a) a semiconductor stack made up of a plurality of semiconductor modules and a plurality of cooling paths, each of the semiconductor modules including a main unit in which semiconductor devices are mounted and power terminals which extend from the semiconductor module, the cooling paths having a cooling medium flowing therethrough to cool the semiconductor modules; (b) a plurality of bus bars coupled to the power terminals, the bus bars including a positive bus bar connecting with a positive electrode of a dc power supply, a negative bus bar connecting with a negative electrode of the dc power supply, and an ac bus bar connecting with an ac load; (c) a capacitor including a first and a second bus bar connector terminal connected to the positive bus bar and the negative bus bar, respectively, and a first and a second input terminal connected to the dc power supply, the capacitor working to smooth dc voltage developed between the positive bus bar and the negative bus bar; and (d) an input terminal table on which the input terminals are mounted.

The capacitor is disposed in alignment with a first direction in which the semiconductor modules are stacked to form the semiconductor stack. The capacitor has a first end and a second end opposed to the first end in a second direction in which the power terminals extend from the semiconductor modules. The first end faces in the second direction. The input terminal table is located near the second end of the capacitor.

In the above structure of the power converter, the capacitor is disposed adjacent the semiconductor stack in the first direction in which the semiconductor modules are stacked. In other words, the capacitor is not located, unlike the prior art power converter 9 in FIG. 11, in the vicinity of the semiconductor stack in the second direction in which the power terminals extend, thus permitting the size or thickness of the power converter in the second direction to be decreased. This provides an increased space for installation of other peripheral parts outside the power converter in the second direction.

Additionally, the input terminal table is located near the second end of the capacitor. In other words, the input terminal table is disposed close to the end of the capacitor which is located on the opposite side of the capacitor from the power terminals in the second direction, thus allowing the length of the input terminals of the capacitor to be decreased. This eliminates the need for long connectors such as the connecting members 99 of the prior art power converter 1 of FIG. 11, thus resulting in a decrease in production cost of the power converter and also permitting the size thereof to be decreased.

The power converter may also include a frame, a converter casing, a frame holding beam, and a capacitor holding beam. The frame retains the semiconductor stack therein. The converter casing has the frame and the capacitor disposed therein. The frame holding beam and the capacitor holding beam each extend from an inner surface of the converter casing in a lengthwise direction of the cooling paths and are disposed between the frame and the capacitor. The frame is held by the frame holding beam. The capacitor is held by the capacitor holding beam.

Specifically, each of the frame and the capacitor is supported by the converter casing at the ends thereof opposed to each other in the first direction. This ensures the stability in installation of the frame and the capacitor in the converter casing and also results in an increased degree of vibration resistance thereof.

The frame holding beam and the capacitor holding beam may be made by a single common beam. This permits the amount of material of the frame holding beam and the capacitor holding beam to be minimized. This results in decreases in production cost and weight of the power converter.

The power converter may also include a beam extending from the inner surface of the converter casing in the first direction. The beam defines a first chamber and a second chamber inside the converter casing. The semiconductor stack and the capacitor are disposed in the first chamber. The input terminal table is mounted in the second chamber. The common beam has a first end and a second end opposed to each other in the lengthwise direction of the cooling paths. The first end is joined to the converter casing. The second end is joined to the beam. In other words, the second end of the common beam does not need to extend near the input terminal table, thus eliminating the physical interference of the common beam with the input terminal table.

The first end of the common beam is joined to the converter casing, while the second end is secured to the beam, so that the common beam is fixed at two points thereof, thus resulting in an increase in vibration resistance of the common beam.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

Figure 1:
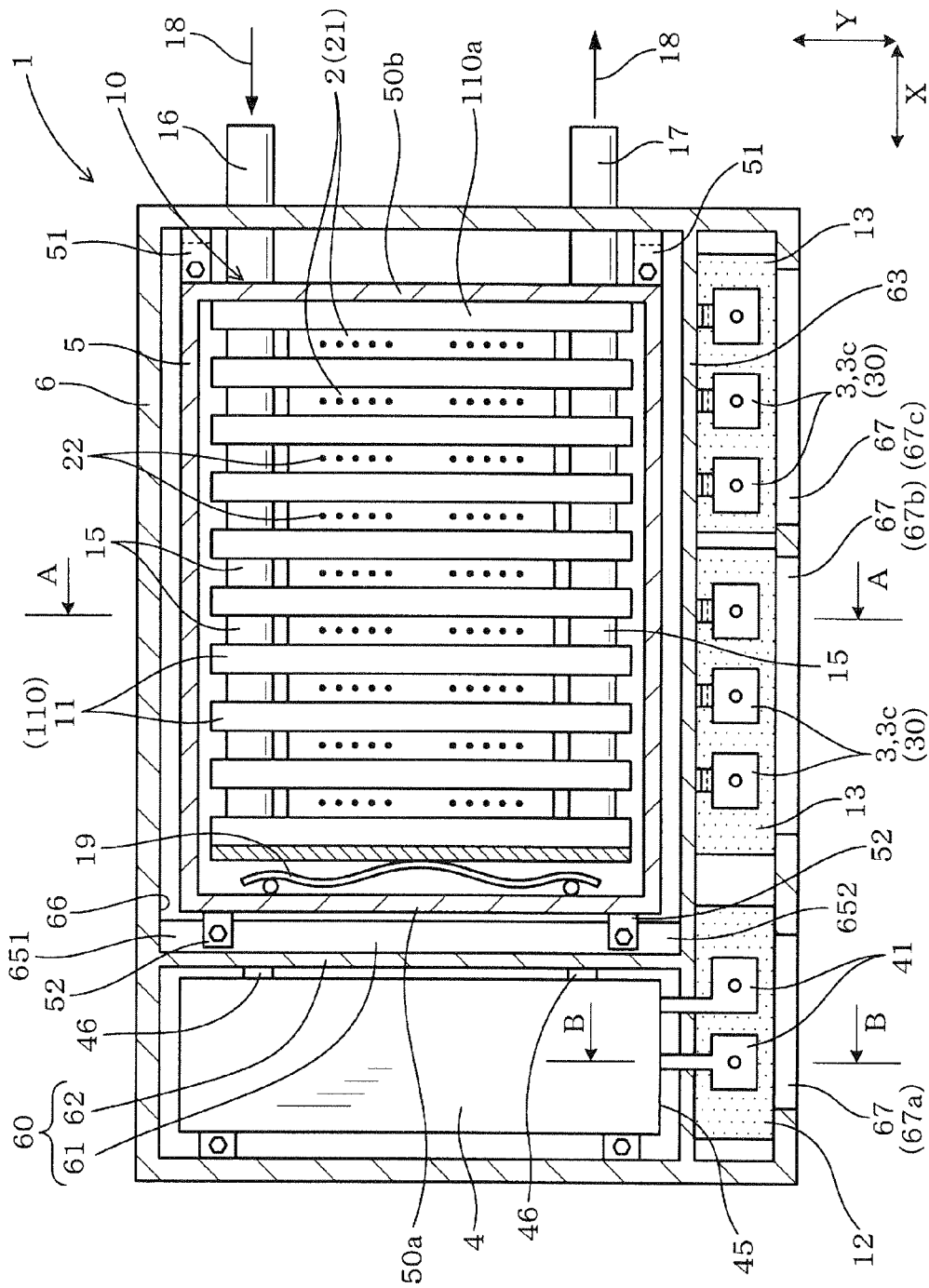
FIG. 1 is a plan view which illustrates a power converter according to the first embodiment.

Referring to the drawings, wherein like reference numbers refer to like parts in several views, particularly to FIGS. 1 to 8, there is shown a power converter 1 which may be mounted in automotive vehicles such as electric vehicles or hybrid vehicles. The power converter 1 is equipped with a semiconductor stack 10, a plurality of bus bars 3, a capacitor 4, and an input terminal table 12. The semiconductor stack 10 is made up of a plurality of semiconductor modules 2 and a plurality of cooling pipes 110. The cooling pipes 110 define therein cooling paths 11.

Figure 6:
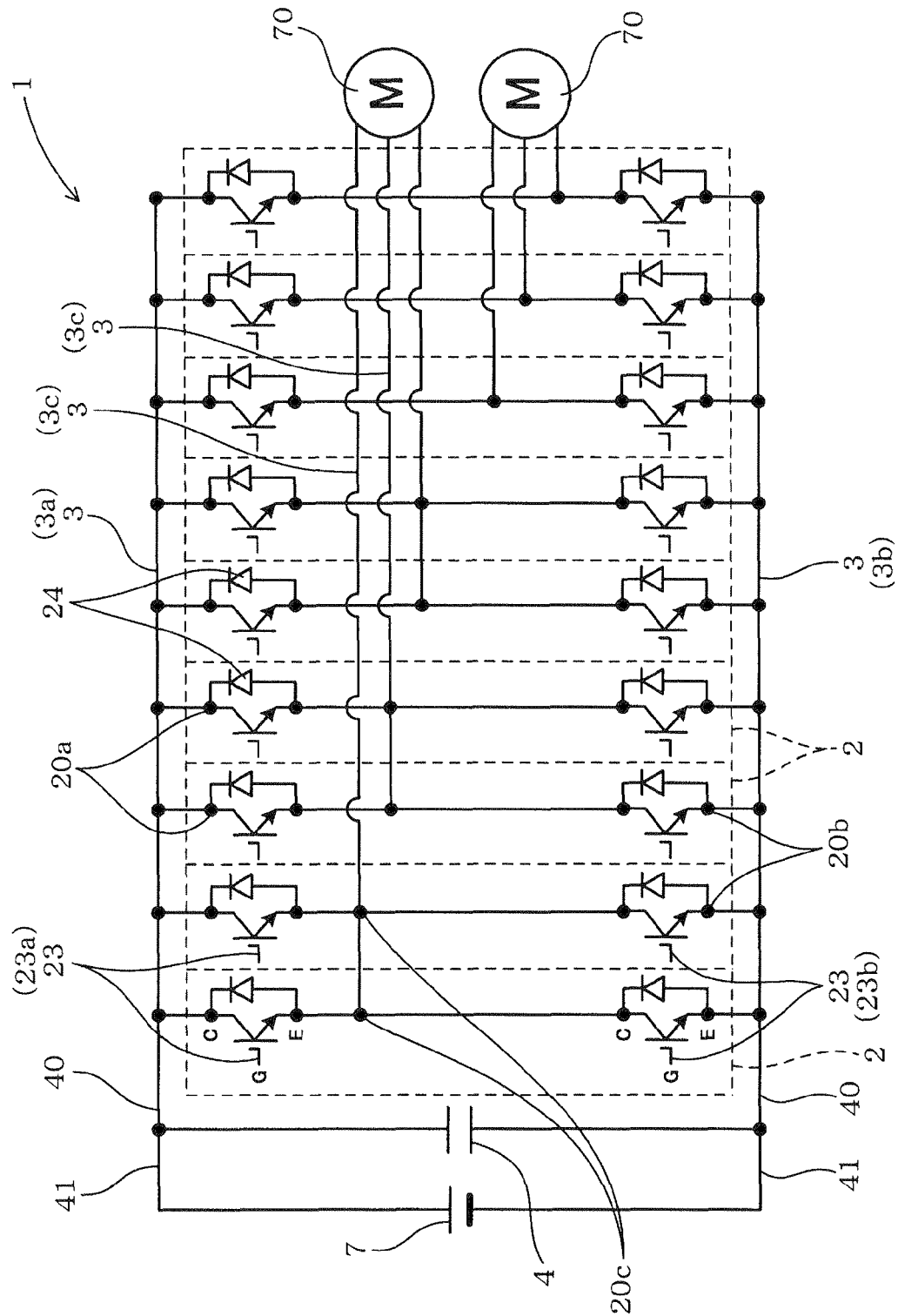
FIG. 6 is a circuit diagram which illustrates an electric structure of the power converter of FIG. 1.

Each of the semiconductor modules 2 includes a main unit 21 in which semiconductor devices, as illustrated in FIG. 6, are fabricated. The main unit 22 has power terminals 20 extending therefrom. Cooling medium or coolant 18 flows through the cooling paths 11 to absorb thermal energy from the semiconductor modules 2.

Figure 7:
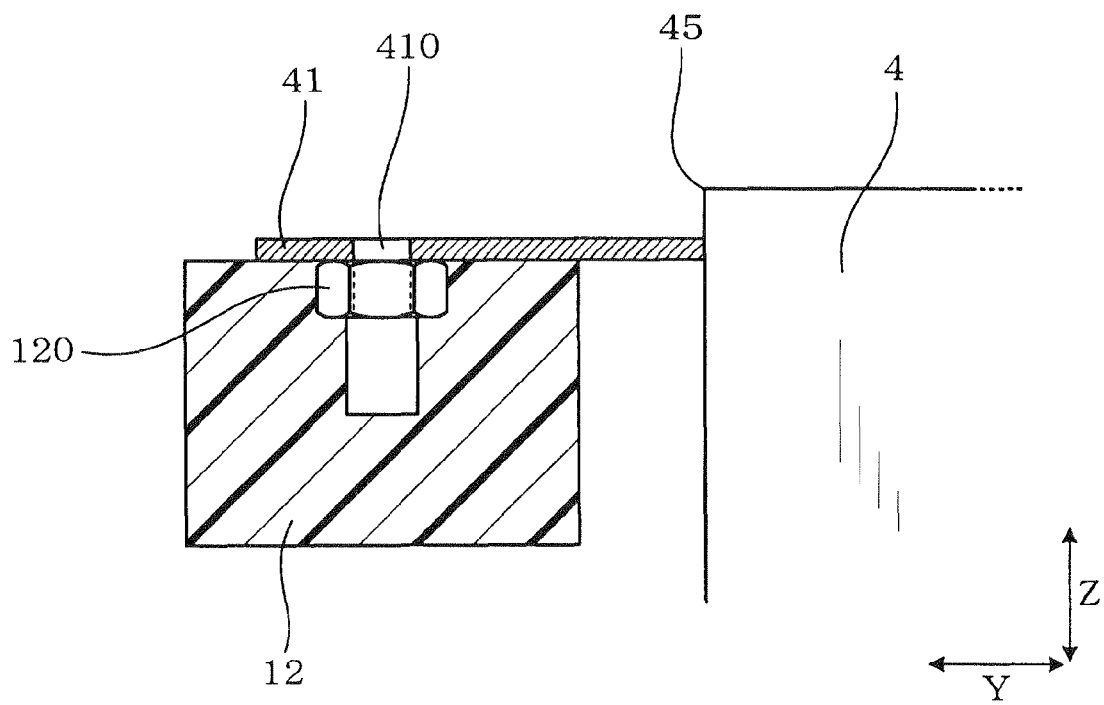
FIG. 7 is an enlarged view taken along the line B-B in FIG. 1.

The bus bars 3 are electrically coupled to the power terminals 20 of each of the semiconductor modules 2. The bus bars 3 are, as clearly illustrated in FIG. 2, made up of a positive bus bar 3a, a negative bus bar 3b, and ac bus bars 3c. Specifically, the positive bus bar 3a is connected to a positive electrode of a dc power supply 7, as illustrated in FIG. 7. The negative bus bar 3b is connected to a negative electrode of the dc power supply 7. The ac bus bars 3c are joined to ac loads 70, as illustrated in FIG. 6.

Figure 5:
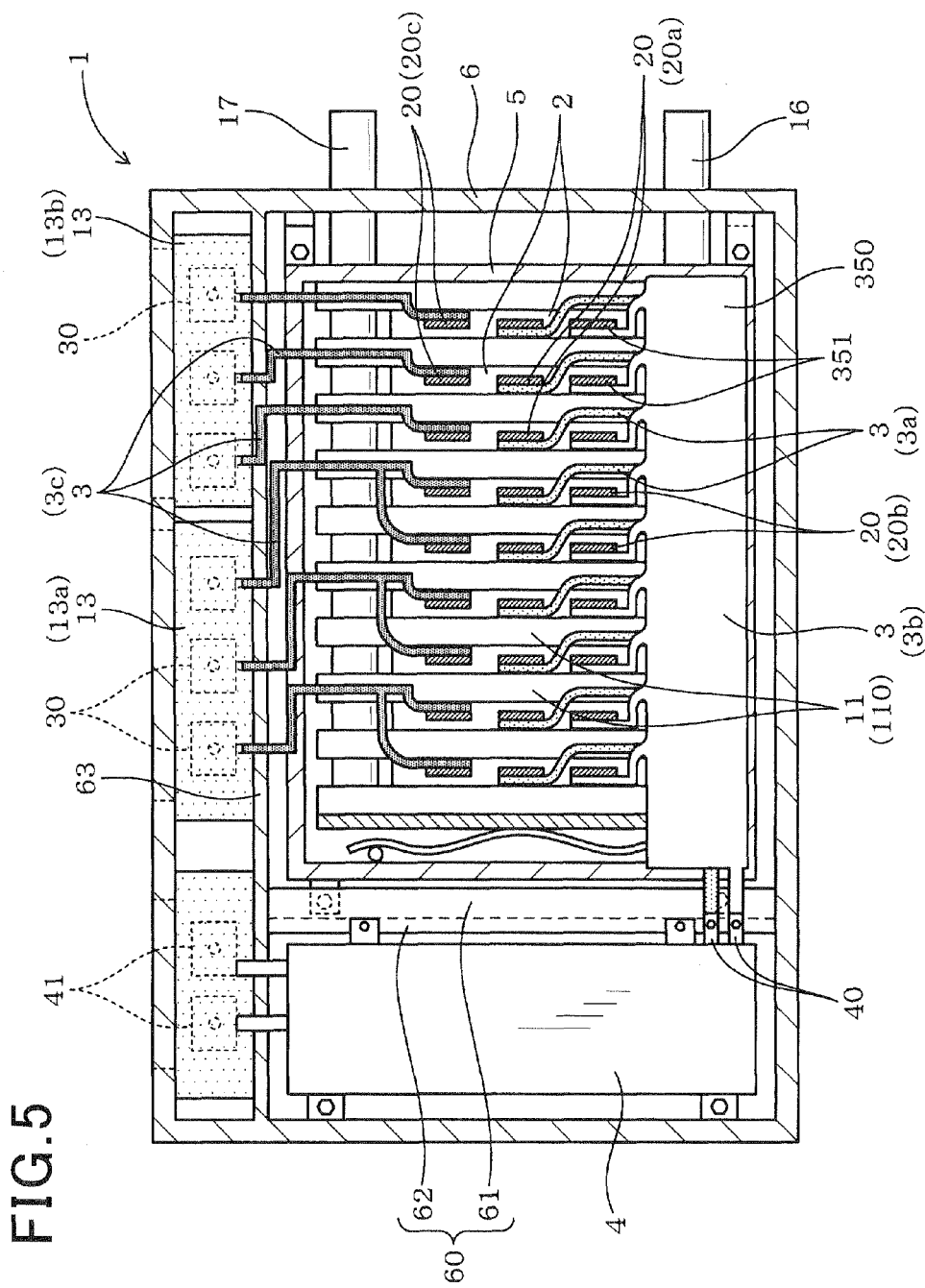
FIG. 5 is a sectional view taken along the line D-D in FIG. 3.

The capacitor 4 is equipped with two bus bar connector terminals 40, as illustrated in FIG. 5, and two input terminals 41, as illustrated in FIG. 1. The bus bar connector terminals 40 are joined to the positive bus bar 3a and the negative bus bar 3b, respectively. The input terminals 41 are joined to the dc power supply 7. The capacitor 4 works to smooth the dc voltage developed between the positive bus bar 3a and the negative bus bar 3b.

The input terminal table 12, as clearly illustrated in FIG. 1, has the input terminals 41 of the capacitor 4 mounted thereon. The capacitor 4 is located adjacent the semiconductor stack 10 in a direction in which the semiconductor modules 2 are laid to overlap each other (which will also be referred to as an X-direction). In other words, the capacitor 4 is disposed at a given interval away from the semiconductor stack 10 in the X-direction.

Figure 3:
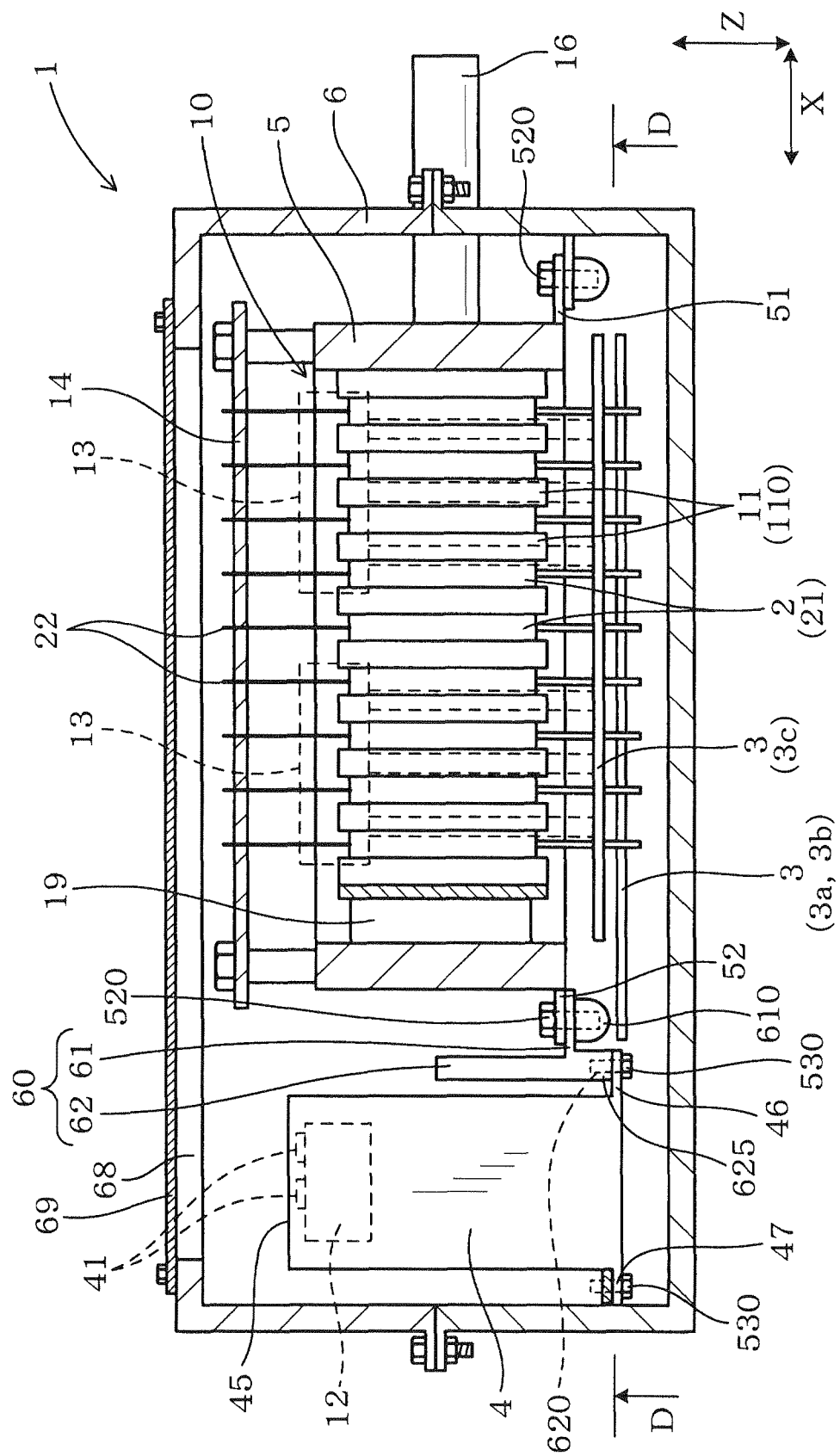
FIG. 3 is a sectional view taken along the line C-C in FIG. 2.

The capacitor 4, as can be seen from FIGS. 3 and 7, has ends opposed to each other in a lengthwise direction of the power terminals 20 (which will also be referred to as a Z-direction). One of the ends of the capacitor 4, as denoted by numeral 45, faces in a direction opposite the direction in which the power terminals 20 extends from the semiconductor modules 2. The input terminal table 12 is, as clearly shown in FIGS. 3 and 7, located close to the end 45 of the capacitor 4.

The input terminals 41 are, as illustrated in FIG. 7, made of strips extending in a Y-direction from a portion of the capacitor 4 which is close to the end 45. The input terminal 41 has formed therein through holes 410 opening in the Z-direction. Nuts 120 are embedded in the input terminal table 12. An electrical and mechanical joint of each of the input terminal 41 to a connector terminal (not shown) of the dc power supply 7 is established by putting the connector terminal on the input terminal 41, inserting a bolt into the hole 410, and tightening the bolt into the nut 120.

Figure 2:
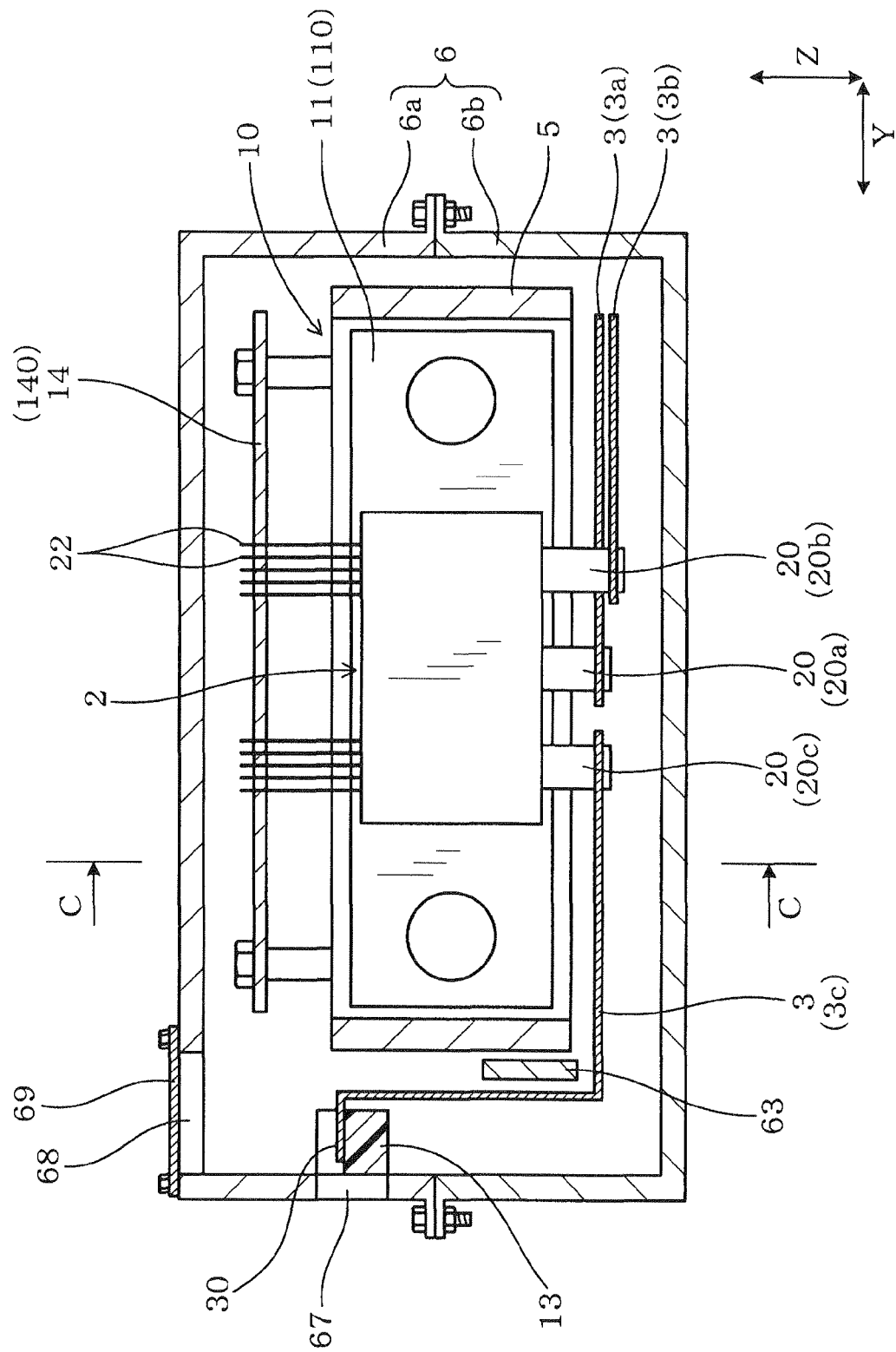
FIG. 2 is a sectional view taken along the line A-A in FIG. 1.

Each of the semiconductor modules 2 is, as illustrated in FIG. 2, equipped with the power terminals 20 and a plurality of control terminals 22. The power terminals 20 of each of the semiconductor modules 20 include a positive terminal 20a which connects with the positive bus bar 3a, a negative terminal 20b which connects with the negative bus bar 3b, and an ac (alternating current) terminal 20c which connects with one of the ac bus bars 3c. The control terminals 22 are joined to a control circuit board 14. The control circuit board 14 has fabricated thereon a control circuit 140 which works to control switching operations of the semiconductor modules 2 to convert the dc voltage applied to the positive terminal 20a and the negative terminal 20b into an ac form. The control circuit 140 outputs the ac voltage from the ac terminal 20c.

The power converter 1 is, as illustrated in FIG. 6, equipped with the six ac bus bars 3c. The ac bus bars 3c have two sets of three connecting terminals 30, each set being mounted on an output terminal table 13 (13a and 13b). Specifically, on each of the output terminal tables 13a and 13b, connecting terminals (not shown) of one of the two ac loads 70 such as electric motors are mounted.

The cooling pipes 110 are, as illustrated in FIG. 1, joined together through connecting pipes 15. The cooling pipes 110 extend in a longitudinal direction of the semiconductor module 2, that is, perpendicular to a direction in which the semiconductor modules 2 are stacked (i.e., the X-direction). The outermost one of the cooling pipes 110 in the X-direction, that is, the cooling pipe 110a is joined to an inlet pipe 14 through which the coolant 18 is loaded into the semiconductor stack 10 and an outlet pipe 17 from which the coolant 18 is discharged outside the semiconductor stack 10. After entering the inlet pipe 16, the coolant 18 is distributed to all the cooling pipes 110 through the connecting pipes 15 and flows out of the outlet pipe 17, thereby absorbing the thermal energy, as produced by the semiconductor modules 2, to cool the whole of the semiconductor stack 10.

The power converter 1 is equipped with a metallic frame 5 which is of a substantially rectangular shape. The metallic frame 5 has two end walls 50a and 50b which extend perpendicular to the X-direction. An elastic member, i.e., a leaf spring 19 is, as illustrated in FIGS. 1 and 3, disposed between the end wall 50a and the end of the semiconductor stack 10. The leaf spring 19 urges the semiconductor stack 10 elastically against the end wall 50b of the frame 5 to retain the semiconductor stack 10 within the frame 5.

The power converter 1 also includes a converter casing 6 in which an assembly of the frame 5 and the semiconductor stack 10, the capacitor 4, the input terminal table 12, and the output terminal table 13 are disposed. The converter casing 6, as clearly illustrated in FIG. 4, includes a frame holding beam 61 and a capacitor holding beam 62 which extend from an inner surface 66 of the converter casing 6 in the longitudinal direction of the cooling pipes 110 (i.e., the Y-direction). The frame holding beam 61 and the capacitor holding beam 62 are disposed between the frame 5 and the capacitor 4.

The frame 5, as illustrated in FIGS. 1 and 3, has ribs 51 and 52 extending from opposed ends thereof in the X-direction. Similarly, the capacitor 4 has sub-ribs 46 and 47 extending from opposed ends thereof in the X-direction. The ribs 51 on one of the ends of the frame 5 are bolted to the converter casing 6. The ribs 52 on the other end of the frame 5 are bolted to the frame holding beam 61.

The sub-ribs 46 on one of the ends of the capacitor 4 are bolted to the capacitor holding beam 62. The sub-ribs 47 on the other end of the capacitor 4 are bolted to the converter casing 6.

The frame holding beam 61 and the capacitor holding beam 62 are made by a single common beam 60. The frame holding beam 61 and the capacitor holding beam 62 are each shaped like a plate. The frame holding beam 61 is oriented to have a normal extending parallel to the Z-direction, while the capacitor holding beam 62 is oriented to have a normal extending parallel to the X-direction. Specifically, the common beam 60 is of an L-shape in traverse section thereof to define the frame holding beam 61 and the capacitor holding beam 62.

The frame holding beam 61 and the ribs 62 have bolt holes opening in the Z-direction. The joining of the ribs 51 to the frame holding beam 61 is achieved by inserting bolts 520 into the bolt holds and fastening hexagon cap nuts 610 on the bolts 520. Similarly, the ribs 51 of the frame 5 have bolt holes formed therein. The joining of the frame 5 to the converter casing 6 is achieved by inserting bolts 520 and fastening hexagon cap nuts 610 on the bolts 520.

Figure 4:
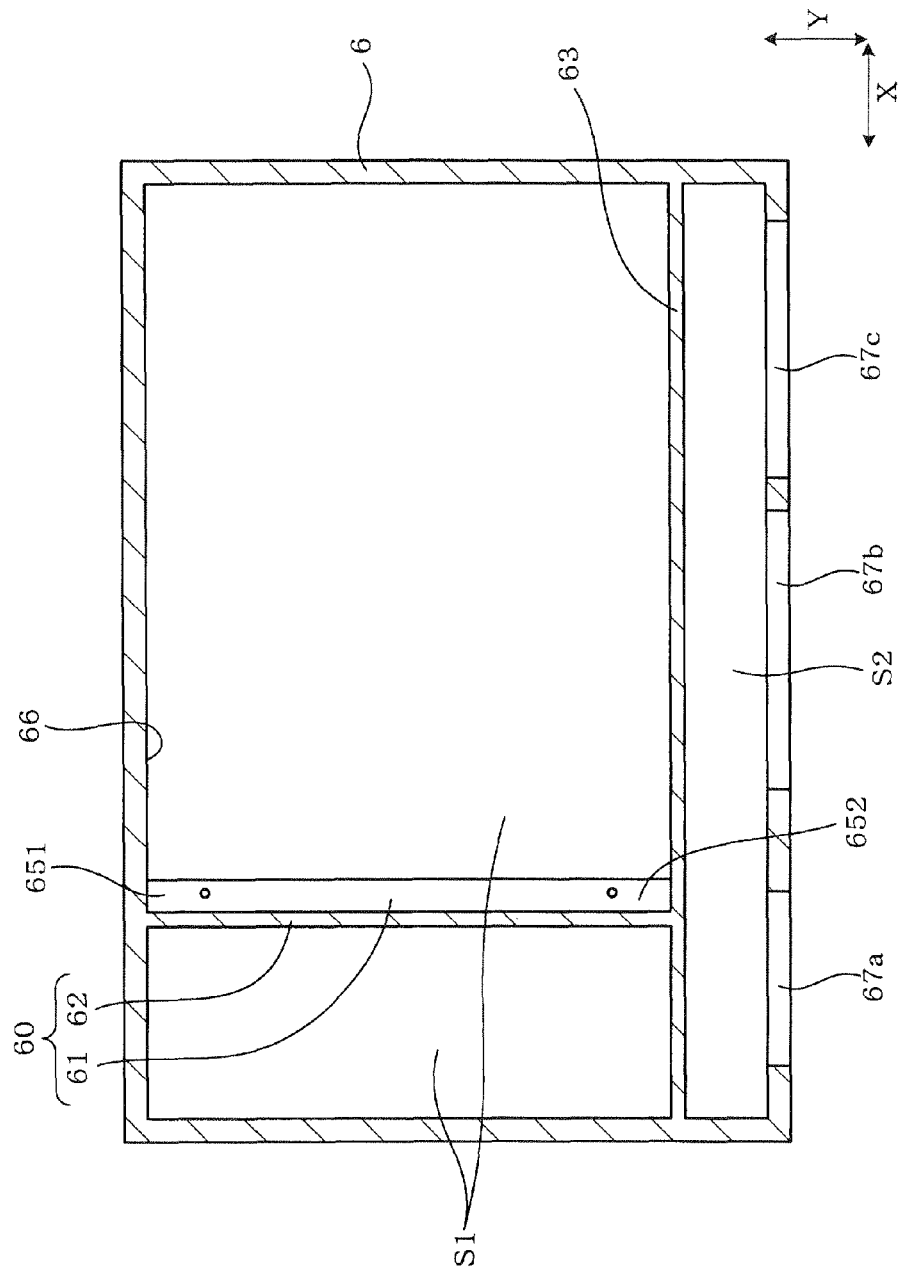
FIG. 4 is a plan view which illustrates a converter casing of the power converter of FIG. 1.

The capacitor holding beam 62, as can be seen in FIG. 4, has an end 625 which is farther away from the control circuit board 14 in the Z-direction and in which internal threads 620 are formed. The sub-ribs 46 of the capacitor 4 have bolt holes opening in the Z-direction. The joining of the sub-ribs 46 to the capacitor holding beam 62 is achieved by inserting bolts 530 into the bolt holes and fastening them to the internal threads 620. Similarly, the sub-ribs 47 of the capacitor 4 have bolt holes formed therein. The joining of the sub-ribs 47 to the converter casing 6 is achieved by inserting bolts 530 into the bolt holes and fastening them.

The power converter 1, as illustrated in FIG. 1, also includes a lengthwise beam 63 extending from the inner surface 66 of the converter casing 6 in the X-direction in which the semiconductor modules 2 are stacked. The beam 63 defines, as illustrated in FIG. 4, a first chamber S1 and a second chamber S2 inside the converter casing 6. In the first chamber S1, the semiconductor stack 10 and the capacitor 4 are disposed. In the second chamber S2, the input terminal table 12 and the output terminal table 13 are mounted. The common beam 60 has ends 651 and 652 opposed to each other in the Y-direction. The end 651 is joined to the converter casing 6. The end 652 is joined to the beam 63.

The converter casing 6 is, as illustrated in FIG. 2, made up of two parts: a first case 6a and a second case 6b which are bolted together. The first case 6a has an opening 68 oriented in the Z-direction. The second case 6b has three terminal through holes 67 (67a, 67b, and 67c), as illustrated in FIG. 1, which open in the Y-direction. The input terminal table 12 and the output terminal table 13 are located near the opening 68 and the terminal through holes 67.

The electrical joining of the power converter 1 to the dc power supply 7 (see FIG. 7) is accomplished by inserting connecting terminals (not shown) of the dc power supply 7 into the terminal through hole 67a, putting bolts through the opening 68 of the converter casing 6, and tightening the bolts to join the connecting terminals and the input terminals 41 together. Similarly, the electrical joining of the power converter 1 to the ac loads 70 (see FIG. 6) is accomplished by inserting the connecting terminals of the ac loads 70 into the terminal through holes 67 and 67c, putting bolts through the opening 68, and fastening the bolts to connect the terminals 30 of the ac bus bar 3c and the connecting terminals of the ac loads 70 together. Subsequently, a cover 69 is secured to the cover casing 6 to close the opening 68.

The negative bus bar 3b is, as clearly illustrated in FIG. 5, made up of a main strip 350 and comb teeth 351. The main strip 350 is made of a metallic plate. The comb teeth 351 extend from the side of the main strip 350 and connect with the negative terminals 20b of the semiconductor modules 2. The positive bus bar 3a is substantially identical in structure with the negative bus bar 3b. The positive bus bar 3a and the negative bus bar 3b are coupled to the bus bar connector terminals 40 of the capacitor 4.

An electric circuit of the power converter 1 will be described below. The power converter 1 is, as can be seen in FIG. 6, equipped with the nine semiconductor modules 2. Each of the semiconductor modules 2 includes two semiconductor devices 23 (e.g., IGBTs) and freewheel diodes 24 each of which is connected in parallel to one of the semiconductor devices 23. The semiconductor devices 23 are broken down into upper arm semiconductor devices 23a connected to the positive bus bar 3a and lower arm semiconductor devices 23b connected to the negative bus bar 3b. The collectors of the upper arm semiconductor devices 23a serve as the positive terminals 20a. The emitters of the lower arm semiconductor devices 23b serve as the negative terminals 20b. The emitters of the upper arm semiconductor devices 23a and the collectors of the lower arm semiconductor devices 23b are connected to the ac terminals 20c. The positive terminals 20a are connected to the positive electrode of the dc power supply 7 through the positive bus bar 3a. The negative terminals 20b are connected to the negative electrode of the dc power supply 7 through the negative bus bar 3b. The ac terminals 30c are coupled to the ac loads 70 (e.g., three-phase electric motors) through the ac bus bars 3c.

The operation and beneficial advantages of the structure of the power converter 1 will be described below.

Figure 11:
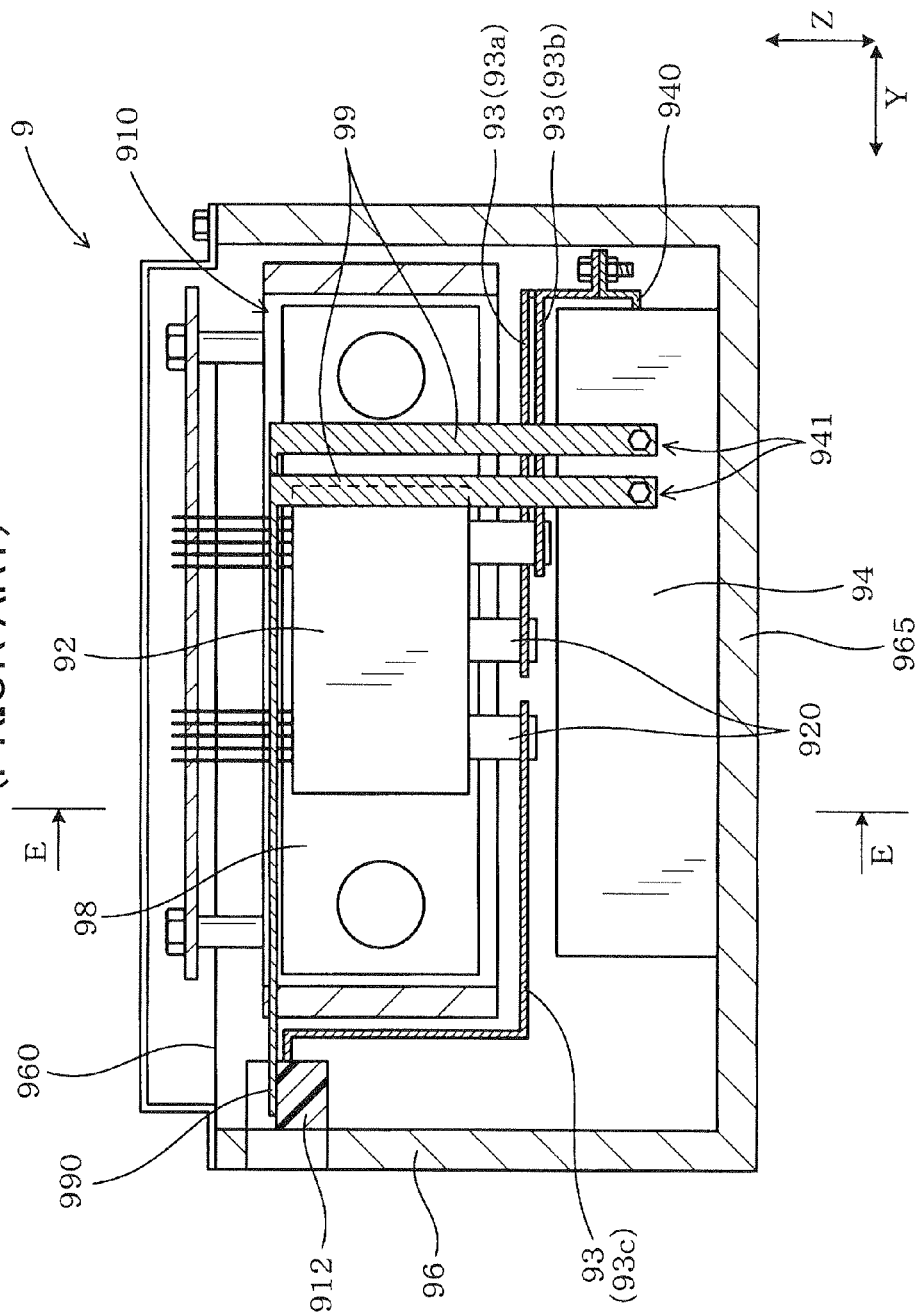
FIG. 11 is a traverse sectional view which illustrates a conventional power converter.
Figure 12:
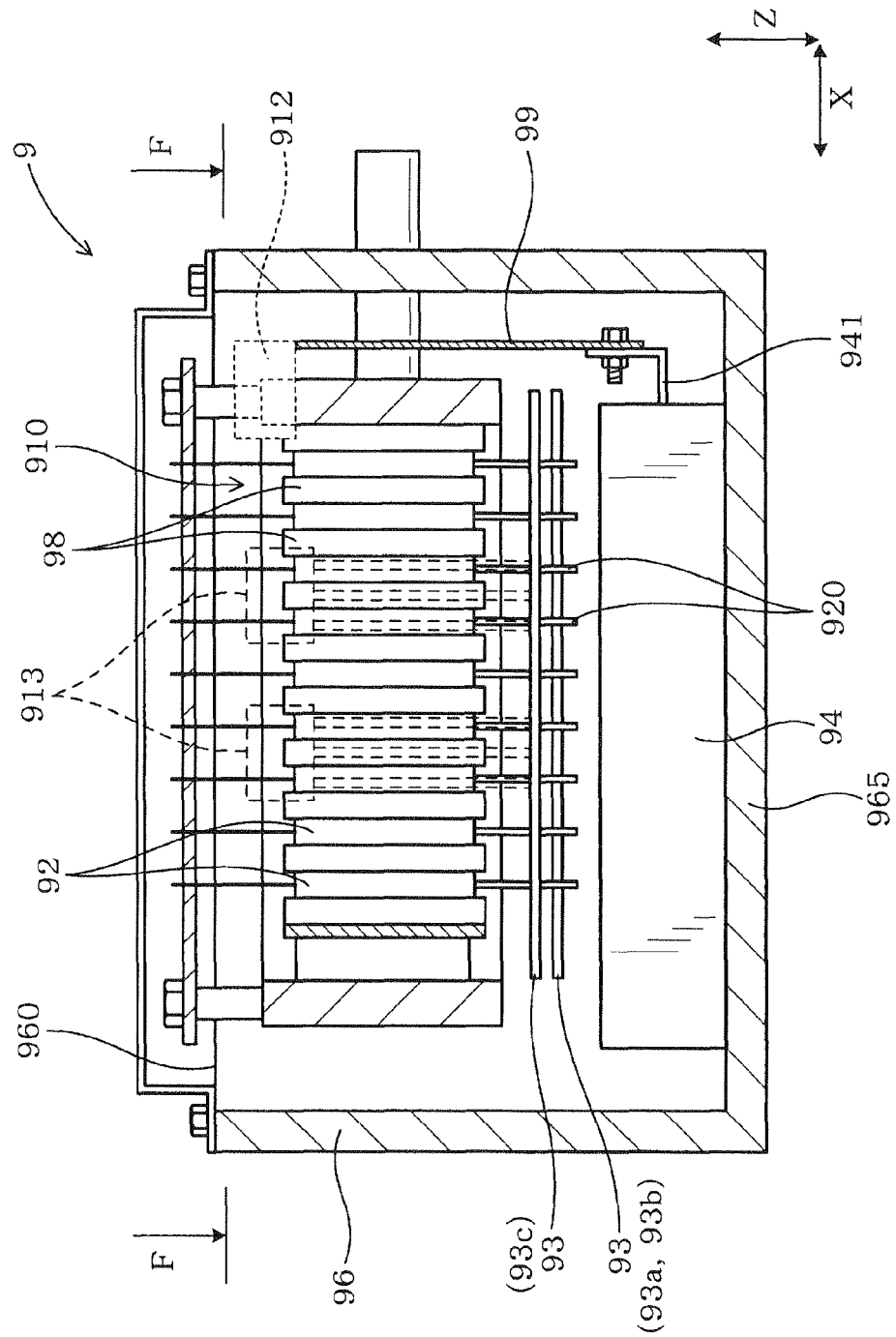
FIG. 12 is a sectional view taken along the line E-E in FIG. 11.
Figure 13:
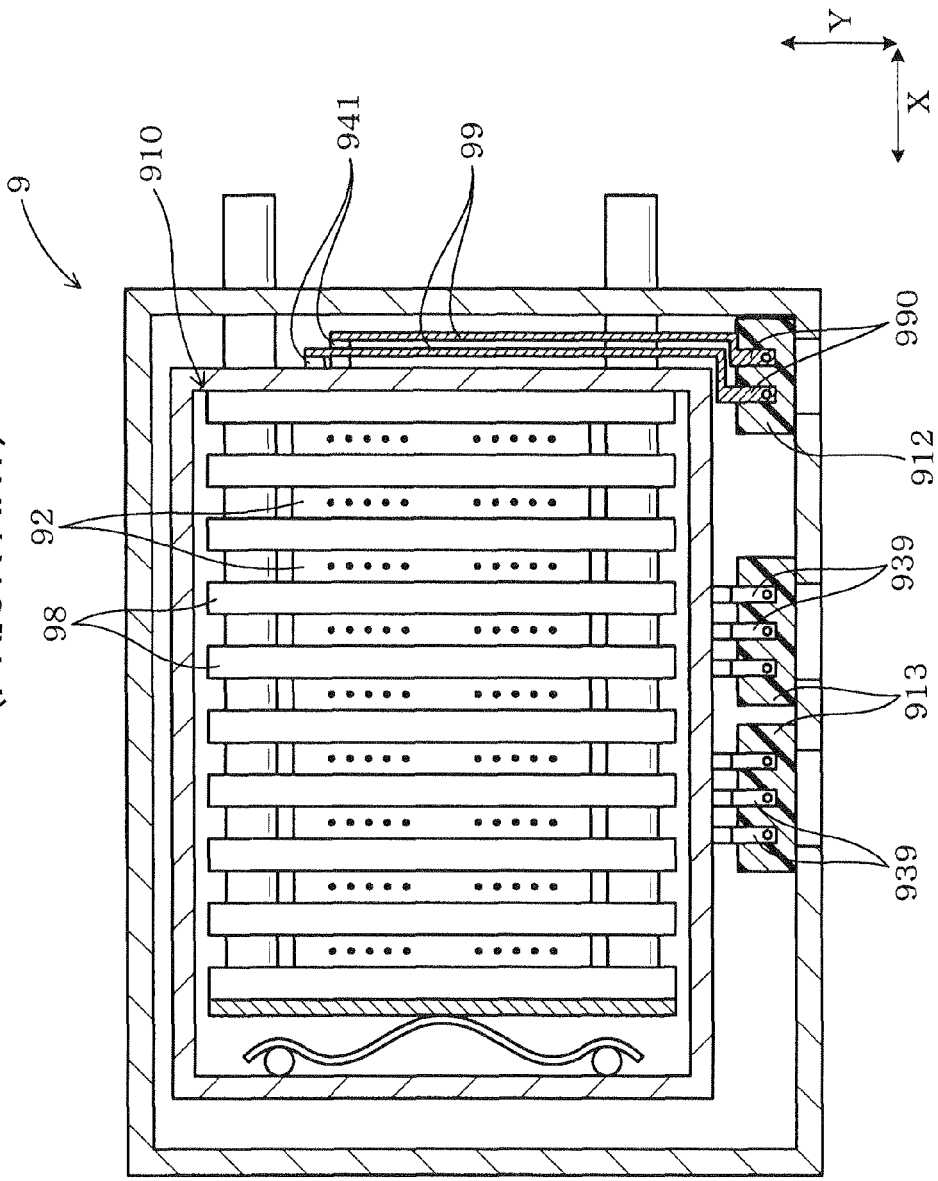
FIG. 13 is a sectional view taken along the line F-F in FIG. 13.

The capacitor 4 is disposed adjacent the semiconductor stack 10 in alignment with the X-direction. In other words, the capacitor 4 is not located, unlike the prior art power converter 9 in FIG. 11, in the vicinity of the semiconductor stack 10 in the Z-direction, thus permitting the size or thickness of the power converter 1 in the Z-direction to be decreased. This provides an increased space for installation of other peripheral parts in the thickness-wise direction (i.e., the Z-direction) of the power converter 1.

The input terminal table 12 is, as clearly shown in FIGS. 3 and 7, disposed close to the end 45 of the capacitor 4 which is located on the opposite side of the capacitor 4 from the power terminals 20 in the Z-direction. In other words, the input terminal table 12 is arranged in the vicinity of the capacitor 4, thus allowing the length of the input terminals 41 of the capacitor 4 to be decreased. This eliminates the need for long connectors such as the connecting members 99 of the prior art power converter 1 of FIG. 11, thus resulting in a decrease in production cost of the power converter 1 of this embodiment and also permitting the size thereof to be decreased.

The power converter 1 of this embodiment is, as illustrated in FIGS. 1 and 3, equipped with the frame holding beam 61 and the capacitor holding beam 62. The frame 5 is retained by the frame holding beam 61. The capacitor 4 is retained by the capacitor holding beam 62. Specifically, each of the frame 5 and the capacitor 4 is supported by the converter casing 6 at the ends thereof (i.e., the ribs 51 and 52 and the sub-ribs 46 and 47) opposed to each other in the X-direction. This ensures the stability in installation of the frame 5 and the capacitor 4 in the converter casing 6 and also results in an increased degree of vibration resistance thereof.

In the case where the power converter 1 is mounted in automotive vehicles such as electric vehicles or hybrid vehicles, mechanical vibrations usually occur during running of the vehicle. The power converter 1 is, therefore, required to exhibit a higher degree of resistance to the vibrations. The above structure of the converter casing 6 to hold the frame 5 and the capacitor 4 tightly is quite effective in protecting the parts of the power converter 1 against the mechanical vibrations during running of the vehicle.

The frame holding beam 61 and the capacitor holding beam 62 are made of a single member (i.e., the common beam 60), thus permitting the amount of material of the frame holding beam 61 and the capacitor holding beam 62 to be minimized. This results in decreases in production cost and weight of the power converter 1.

The power converter 1, as illustrated in FIG. 1, also includes the lengthwise beam 63 extending from the inner surface 66 of the converter casing 6 in a stacking direction (i.e., the X-direction) in which the semiconductor modules 2 are stacked. The common beam 60 has the ends 651 and 652 opposed to each other in the Y-direction. The end 651 is joined to the converter casing 6. The end 652 is joined to the lengthwise beam 63. In other words, the end 652 of the common beam 60 does not need to extend near the input terminal table 12 and the output terminal table 13, thus eliminating the physical interference of the common beam 60 with the input terminal table 12 and the output terminal table 13.

The end 651 of the common beam 60 is, as described above, joined to the converter casing 6, while the end 652 is secured to the lengthwise beam 63, so that the common beam 60 is fixed at two points thereof, thus resulting in an increase in vibration resistance of the common beam 60.

The structure of the power converter 1 of this embodiment is, as apparent from the above discussion, permitted to be reduced in size and production cost.

Figure 8:
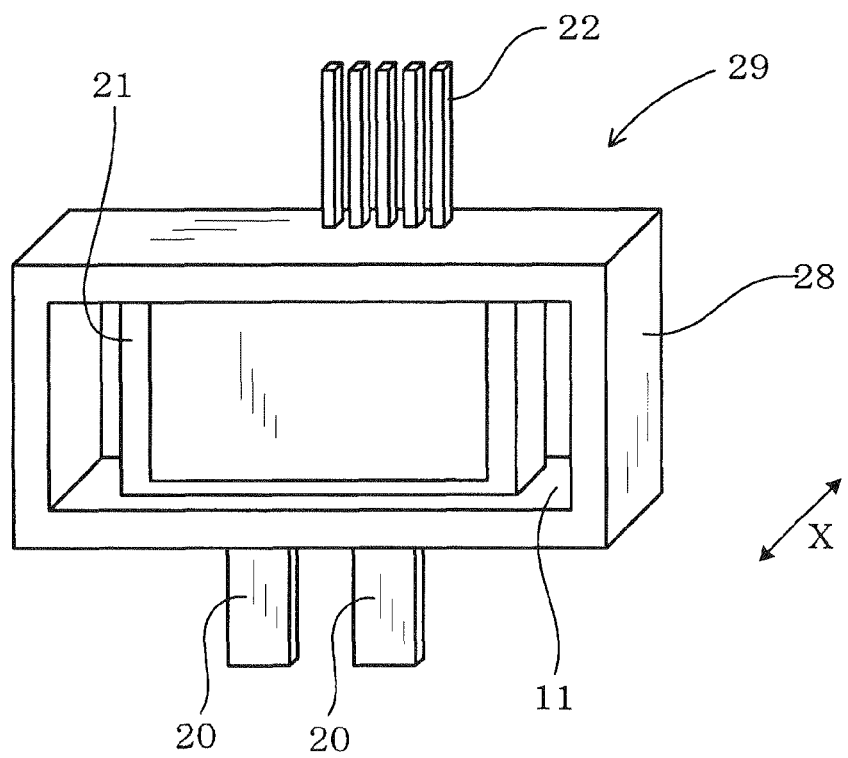
FIG. 8 is a perspective view which illustrates a modification of semiconductor modules installed in the power converter of FIG. 1.

The semiconductor stack 10 is, as described above, made up of the cooling pipes 110 and the semiconductor modules 2 which are laid to overlap each other, but however, it may be built up, as illustrated in FIG. 8, from a plurality of cooler/semiconductor modules 29 each of which is made by an assembly of an unit 21 in which semiconductor devices are mounted and a frame 28. The frame 28 is greater in width than the unit 21 in the X-direction. The unit 21 is so disposed inside the frame 28 as to define chambers which form the cooling paths 11.

Figure 9:
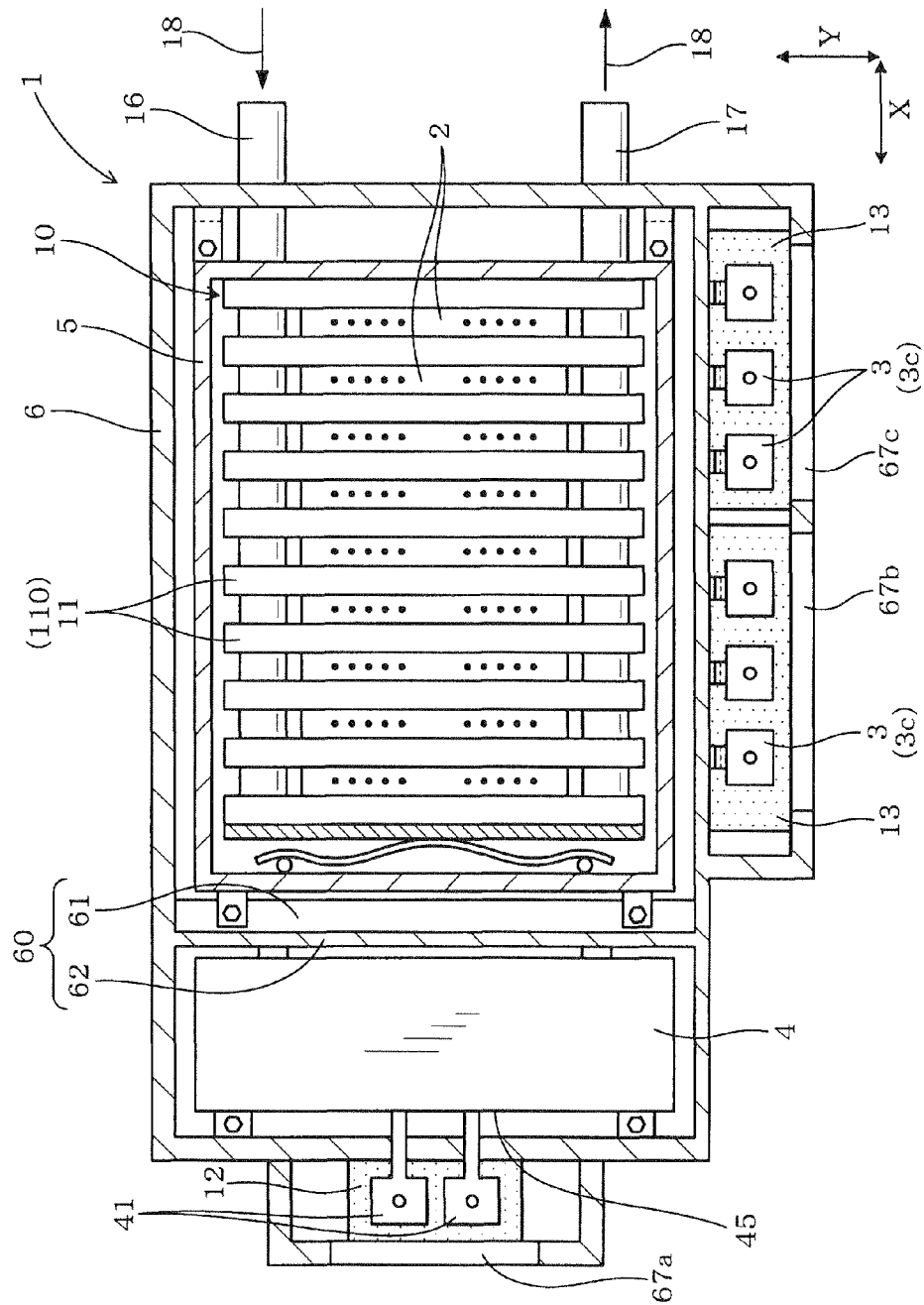
FIG. 9 is a plan view which illustrates a power converter according to the second embodiment.

FIG. 9 illustrates the power converter 1 of the second embodiment. The same reference numbers, as employed in the first embodiment, refer to the same parts, and explanation thereof in detail will be omitted here.

The input terminal table 12 is disposed in alignment with the capacitor 4 in the X-direction. The input terminals 41 extend on the opposite side of the capacitor 4 from the semiconductor stack 10 and are mounted on the input terminal table 12. This arrangement is useful in the case where it is difficult to install the input terminal table 12 adjacent the capacitor 4 in the Y-direction in terms of physical interference with other devices disposed around the power converter 1.

Other arrangements and operations are identical with those in the first embodiment.

Figure 10:
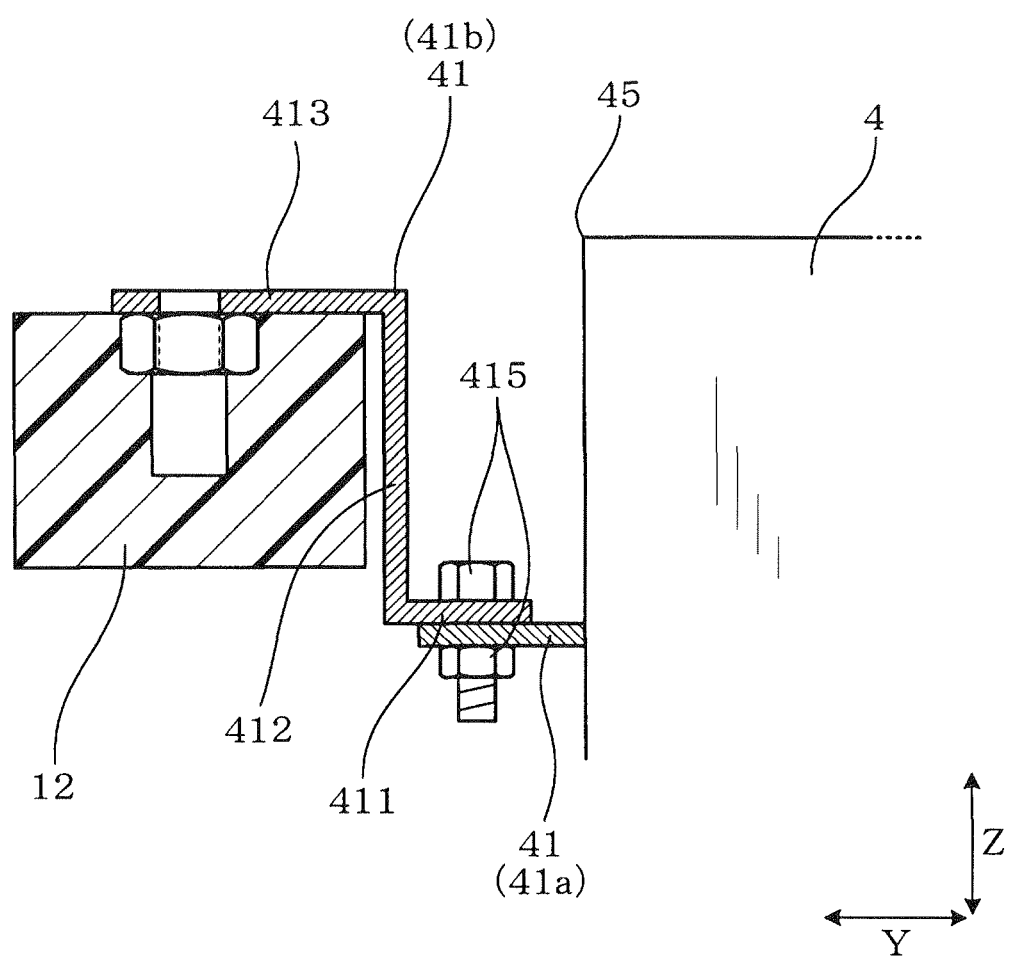
FIG. 10 is an enlarged sectional view which illustrates a structure of an input terminal of a power converter according to the third embodiment.

FIG. 10 illustrates the power converter 1 of the third embodiment which is different in configuration of the input terminals 41 of the capacitor 4 from that of the first embodiment. The same reference numbers, as employed in the first embodiment, refer to the same parts, and explanation thereof in detail will be omitted here.

The capacitor 4 has two input terminals 41: a first input terminal 41a and a second input terminal 41b. The first input terminal 41a is located away from the end 45 of the capacitor 4 in the Z-direction.

The second input terminal 41b is held on a terminal table 12 through a claw retainer(s) not shown which is formed on the terminal table 12. The first input terminal 41a and the second input terminal 41b are joined together by a fastening mechanism 415 (i.e., a bolt and a nut in this embodiment).

The second input terminal 41b is formed by a first section 411, a second section 412, and a third section 413. The first section 411 extends in the Y-direction and is joined to the first input terminal 41a. The second section 412 extends from one of ends of the first section 411 in the Z-direction. The third section 413 extends from the other end of the second section 412 in the Y-direction. The third section 413 is mounted on the terminal table 12. Other arrangements are identical with those of the power converter 1 of the first embodiment.

The above structure of the power converter 1 of the third embodiment is so designed that the first input terminal 41a of the capacitor 4 is located away from the end 45 of the capacitor 4, thus resulting in an increase in degree of freedom of designing the capacitor 4. The length of the second input terminal 41b (i.e., the second section 412) in the Z-direction is preferably minimized. For example, the second section 412 is so shaped as to extend at right angles from the first section 411. This results in a minimum amount of metallic material of the second input terminal 41b, thus decreasing the production cost thereof and minimizing the electric resistance that is a factor in producing the heat in the second input terminal 41b.

While the present invention has been disclosed in terms of the preferred embodiment in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A power converter comprising:
a stack made up of a plurality of semiconductor modules and a plurality of cooling paths, the semiconductor modules including main bodies in which semiconductor devices are mounted and power terminals which protrude from the main bodies, the cooling paths having a cooling medium flowing therethrough to cool the semiconductor modules;
a plurality of bus bars coupled to the power terminals, the plurality of bus bars including a positive bus bar connecting with a positive electrode of a dc power supply, a negative bus bar connecting with a negative electrode of the dc power supply, and an ac bus bar connecting with an ac load;
a capacitor including a pair of bus bar connector terminal connected to the positive bus bar and the negative bus bar, and a pair of input terminal connected to the dc power supply, the capacitor working to smooth dc voltage developed between the positive bus bar and the negative bus bar; and
an input terminal block on which the input terminals are mounted,
wherein the capacitor is disposed adjacent said stack in a stacking direction of said stack; and
wherein the input terminal block is located near an end of the capacitor on a side opposite a side where the power terminals are provided in a protruding direction of the power terminals.

2. A power converter as set forth in claim 1, further comprising a frame having said stack fixed inside it, a storage casing in which the capacitor and the frame are disposed, a frame holding beam, and a capacitor holding beam which extend from an inner surface of the storage casing in a lengthwise direction of the cooling paths and are disposed between the frame and the capacitor, and wherein the frame is fixed on the frame holding beam, and the capacitor is fixed on the capacitor holding beam.

3. A power converter as set forth in claim 2, wherein the frame holding beam and the capacitor holding beam are made by a single common beam.

4. A power converter as set forth in claim 3, further comprising a stacking direction extending beam which extends from the inner surface of the storage casing in said stacking direction, the stacking direction extending beam defining a first portion and a second portion of the storage casing, the stack and the capacitor being disposed in the first portion, the input terminal block being mounted in the second portion, and wherein the common beam is connected at an end in the lengthwise direction to the storage case and at the other end to the stacking direction extending beam.

* * * * *